US006794913B1

(12) United States Patent
Stengel

(10) Patent No.: US 6,794,913 B1
(45) Date of Patent: Sep. 21, 2004

(54) DELAY LOCKED LOOP WITH DIGITAL TO PHASE CONVERTER COMPENSATION

(75) Inventor: Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/447,443

(22) Filed: May 29, 2003

(51) Int. Cl.[7] .............................................. H03L 7/06
(52) U.S. Cl. ...................... 327/158; 327/161; 375/376
(58) Field of Search ............................ 327/146–150, 327/153, 155–163; 375/373–376; 331/DIG. 2, 1 A

(56) References Cited

U.S. PATENT DOCUMENTS

| | | | | |
|---|---|---|---|---|
| 5,451,894 A | * | 9/1995 | Guo | 327/241 |
| 5,926,047 A | * | 7/1999 | Harrison | 327/159 |
| 5,940,609 A | * | 8/1999 | Harrison | 713/503 |
| 5,995,441 A | * | 11/1999 | Kato et al. | 365/233 |
| 6,100,735 A | * | 8/2000 | Lu | 327/158 |
| 2003/0099321 A1 | * | 5/2003 | Juan et al. | 375/376 |

* cited by examiner

Primary Examiner—Minh Nguyen

(57) ABSTRACT

A delay locked loop circuit 300 consistent with certain embodiments of the present invention has a delay line 304 with coarse adjustment 322 and fine adjustment 360 inputs. The coarse adjustment input 322 provides an overall adjustment of all of the delay line's delay elements while the fine adjustment inputs 360 permit adjusting the individual delay value of each delay element. A first multiplexer 330 receives the delay tap outputs and produces a first selected output while a second multiplexer 334 also receives the delay tap outputs and produces a second selected output. A measurement circuit 344 measures a difference between the first and second output as a measurement of a selected delay element's delay value. An error calculator 346 receives the output of the measurement circuit and calculates fine adjustment voltages for each of the selected delay elements. A tuning circuit 350 applies the fine adjustment voltages to the fine adjustment inputs of the delay line 304.

27 Claims, 8 Drawing Sheets

DELAY LOCKED LOOP WITH DIGITAL TO PHASE CONVERTER COMPENSATION

CROSS REFERENCE TO RELATED APPLICATIONS

This application is related to the following applications: Ser. No. 10/000,914 filed Nov. 2, 2001, and Ser. No. 10/050,233 filed Jan. 16, 2002.

FIELD OF THE INVENTION

This invention relates generally to the field of delay locked loops. More particularly, certain embodiments consistent with this invention relate to compensation of individual delay variations in delay line elements used in a digital to phase converter.

BACKGROUND OF THE INVENTION

A more or less conventional delay locked loop circuit 20 is depicted in FIG. 1.

In this delay locked loop circuit 20, a delay line 24 is made up of a plurality of cascaded controlled delay elements 32, 34, 36 through 38, each having an input and an output In delay line 24, N such delay elements are provided each having a delay D. Such a delay line can be implemented using, for example, a series of inverter buffers, each with a voltage controlled delay for adjustment of the value of D. Thus, delay line 24 has an overall delay of N×D. The overall delay of delay line 24 is tuned by a voltage (or other suitable control signal) applied to a control input 44. A suitable signal applied to input 44 simultaneously adjusts the delays of each of the N delay elements (which are preferably closely matched) to produce an overall adjustment in the delay N×D. A tapped output is available at each of the delay elements 32, 34, 36 through 38 having a total amount of delay dependent upon the number of delay elements encountered from the input of the delay line 24.

In delay locked loop 20, a clock signal $F_{REF}$ is applied to an input 48 and, after encountering N×D delay, exits at output 52. The output at 52 and the input at 48 are each applied to a phase detector 56 that produces an output that represents the difference in phase between the two inputs. This output is filtered by a low pass filter 60. The output of the low pass filter 60 drives the control input 44 to effect a tuning of the delay line 24 so that the delay line 24 is adjusted to produce an output at output 52 that is a total of a predetermined delay from the input signal applied at input 48. One choice for the delay would be one input clock cycle or $1/F_{REF}$. In order to produce accurately synthesized signals at the output 66 of multiplexer 70, the delays associated with each delay element 32, 34, 36, . . . , 38 should be equal.

A delay locked loop (DLL) synthesizer as shown in FIG. 1 can potentially be used as a frequency synthesizer in many electronic devices such as wireless telephones (e.g., cellular telephones), two-way radio transceivers, radio transmitters and radio receivers. Such synthesizers are sometimes referred to as digital to phase converters (DPC). However, to effectively use a DLL in such applications, frequency output should be accurate and relatively free of errors caused by manufacturing variations in the delay of the delay elements.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
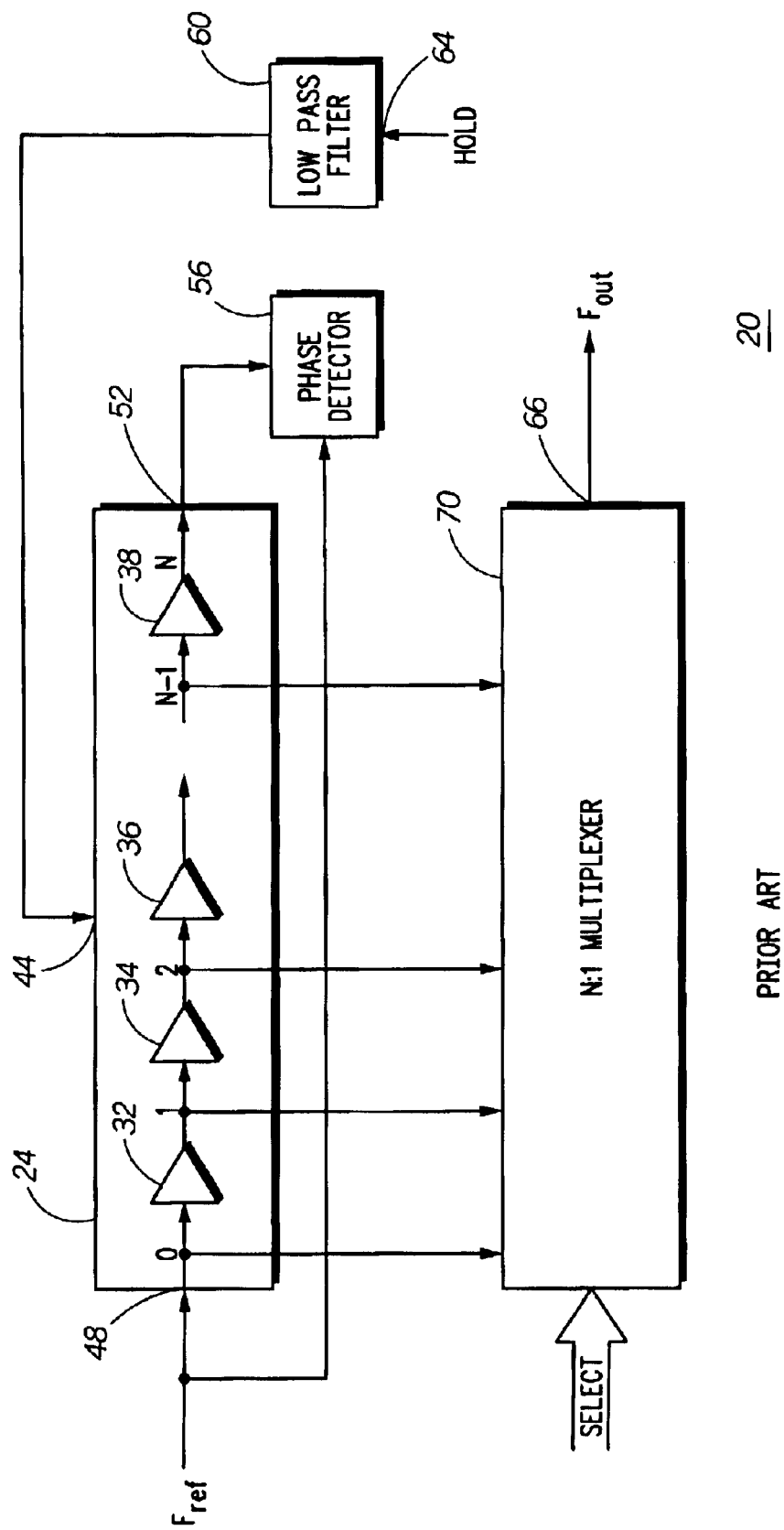
FIG. 1 is a block diagram of a conventional delay locked loop.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a serviet, a source code, an object code, a shared library/ dynamic load library and/or other sequence of instructions designed for execution on a computer system.

Referring back to FIG. 1, delay line 24, as shown, has an input 48 which is equivalent to the $0^{th}$ tap and an output 52 which is the output of the last ($N^{th}$) delay element of the delay line in the embodiment shown. Thus, the delay line 24 can be considered to have an input 48 and N+1 outputs. However, when the input 48 and output 52 are locked in the delay locked loop arrangement shown on a full wavelength of $F_{REF}$, they constitute essentially the same signal (after a startup period during which time the loop achieves lock).

In certain embodiments where the output frequency is significantly lower than the input reference clock frequency, there is an opportunity to reduce power consumption by turning off parts of the delay locked loop. This means that the delay locked loop is potentially running open loop during some portion of the time. For such embodiments, the low pass filter 60 may be implemented using a hold input 64 to hold the output value of the filter 60 at a fixed value in response to an appropriate input signal at 64 (thus fixing the overall delay of delay line 24) whenever necessary to keep the delay locked loop at a fixed tuning voltage. Such a hold arrangement can be implemented in a manner similar to conventional sample and hold circuits (or otherwise) and is only needed for the pulsed embodiment described. The hold signal can be produced by a microcontroller or suitable hard-wired logic. Thus, once locked, the delays can be fixed by holding the tune signal fixed for periods of time and only occasionally turned on to make adjustments to the lock.

Those skilled in the art will appreciate that the delay locked loop 20 of FIG. 1 does not illustrate special circuitry sometimes used to prevent false locking. Such circuitry can be readily added if desired or needed without departing from the invention, but is not necessary to the understanding of the present invention.

In order to produce a signal having a frequency synthesized from the clock signal input at 48, a suitable combination of output signals from the delay line's tapped outputs can be assembled to approximate the desired signal. Consider, for example and not by way of limitation, a delay locked loop circuit 20 having the following circuit parameters when locked:

Reference clock frequency=$F_{ref}$=450 Mhz
Number of delay elements=N=32
Average buffer delay=D=69.444 pico-seconds
Total Delay Line delay=N×D=2222.2 pico-seconds For this example 32 buffers or other suitable delay elements with 69.444 p second delay each are driven with a 450 MHz input clock signal and locked to a total delay of 2222.2 pico-seconds. Each of the taps supply a 450 MHz output signal with each tap having 11.25 degrees of offset (69.444 pico-seconds delay) from the preceding tap output.

The present circuit arrangement can be used to provide direct digital selectable signals with accurate time or phase shifted relation to the input clock signal. Each of the N+1 selectable signals from the delay line 24's tap outputs have frequency and duty cycle equal to that of the input clock signal, but are shifted in time by a predictable delay. These time shifted output signals are selected (using an output control circuit arrangement) in an organized manner as a function of time to produce a new signal with independent parameters from the original input clock signal. This tap selection process is discrete, i.e., does not have continuous delay values. This causes delay quantization error for most output signal frequency ($F_{out}$) applications. However, a number of special solutions for $F_{out}$, $F_{clk}$, and N can be used to provide a tap selection process with essentially zero delay quantization error. These special solutions can be determined using the following relationship:

$$F_{out} = \frac{F_{clk}}{x + y/N} \qquad \text{Eqn. 1}$$

where x and y are integers, such as x=1, y=8, $F_{clk}$=450 MHz, and N=32. What results is $F_{out}$ equal to $F_{clk}$/1.25=360 MHz with tap selection pattern of 0, 8, 16, and 24 every $F_{clk}$ cycle with one cycle skipped before the tap zero selection. A benefit of operating conditions satisfying equation 1 is that there would be no delay line tap selection quantization error. This means any spurs occurring in the direct digital synthesizer output with operating parameters satisfied by equation 1 are the result of delay difference from 24 delay line elements 32, 34, 36, and 38, where spurious signals are frequency domain power at the output 66 of DLL 20 located other than the intended $F_{out}$ frequency defined in equation 1. Measurement of these spurious signal levels relative to the level of $F_{out}$ are an indication of the output signal quality, where a larger ratio between $F_{out}$ and the maximum spurious signal level is improved output signal quality and reduction in delay difference from 24 delay line elements 32, 34, 36, and 38.

In order to accurately produce any desired output from DLL 20, the delays of each of the individual delay elements 32, 34, 36, . . . , 38 should ideally be identical. When such delay elements are produced on a single semiconductor wafer with all transistors being the same size and located physically close in proximity, this is a good approximation for many applications. However, some error from delay element to delay element can still exist. For the exemplary 32 element delay line depicted above, worst case manufacturing tolerances can result in errors of approximately ±1 pico second per delay element (when current technology CMOS buffers are used) out of the average buffer delay of 69.4 p seconds. Unfortunately, under worst case scenarios, the delay errors can add up for delay line tap positions as they get farther away from the reference points used by the phase detector 56.

Delay line tap positions that are processed through the phase detector 56 of the delay locked loop network 20 are adjusted to an improved delay variation with an ideal value of zero at the ends of the delay line (assuming a full wavelength of the input clock is locked across the delay line). The delay variation of each buffer stage increases for tap positions further away from these locked taps (in this example, tap positions 0 and 32, and in general 0 and N). The maximum variation being the tap position midway between the locked taps. For the example shown with tap positions 0 and 32 wavelength locked, the variation at tap 16 can be as high as about ±16 p seconds or nearly ±25% of the desired individual buffer stage delay. While this is a worst case scenario, even significantly smaller errors could represent a substantial problem.

Figure 2:
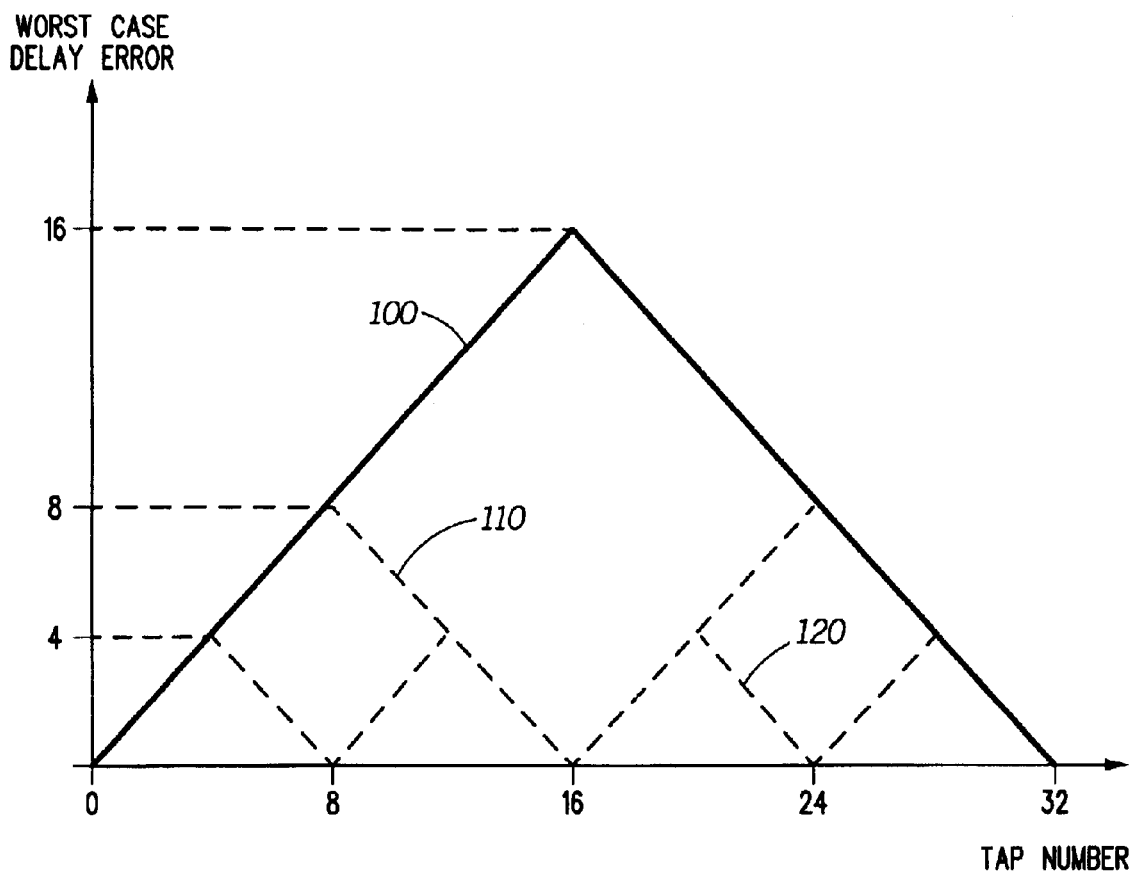
FIG. 2 is a graph depicting potential worst case delay errors in the delay line.

The errors described under this worst-case scenario are depicted as curve 100 of FIG. 2. Curve 100 is seen to peak at 16 ps at the sixteenth tap and drop to zero at the end points of zero and 32. Significant improvement in the error can be obtained if, rather than locking the DLL onto a full wavelength of $F_{REF}$, the DLL is locked at one half wavelength of $F_{REF}$. In this scenario, the phase detector 56 compares and locks the center tap (tap 16 in this example) with the end points of the delay line 24. In this manner, the error falls to zero at the center and remains at zero at the end points. To accomplish this, two separate loops may be used with two phase detectors and low pass filters. In such a configuration, a slightly different phase detector configuration is used to lock an inversion of the center delay line tap with a second reference (the 0 tap in one case and the N tap in another) to thus create zero error at the end taps and center tap with potential errors increasing in between. In the current example 32 tap delay line, the worst case error is depicted by curve 110 with the worst error being ±8 ps at taps 8 and 24 (or in general, the taps located ¼ and ¾ across the delay line).

By further extending this concept, an additional ½ wavelength lock can be carried out at these worst-case taps (8 and 24) to produce approximately zero error at these taps, with maximum error again halved to ±4 ps at the mid points located between all of the zeroed tap positions. This worst-case error scenario is depicted as curve 120 of FIG. 2. In the limit, this process can be used to correct errors in each and every one of the delay elements to achieve a near ideal delay at each tap output.

Thus, addition of multiple delay locked loops can be used to improve this delay make tolerance variation. Multiple delay locked networks can be implemented in sequential independent sections or co-mingled with the tuned control signal as a result of summing or other combination signal processing. In order to achieve the ideal case of zero errors at the corrected nodes, the above assumes that the discrete segments of the delay line can be individually corrected in the DLL locking process.

The use of multiple delay locked loops as described above can be used to minimize the maximum tap-to-tap error in the delay line 24. The circuit 300 depicted in FIG. 3 can also he used to minimize the maximum tap-to-tap error while potentially reducing the amount of hardware used to achieve individual correction of each tap's delay. In this embodiment, a basic DLL circuit is made up of a delay line 304 that receives the reference input clock $F_{REF}$ and produces a delayed version thereof that is applied to one input of a phase detector 308. The second input of the phase detector is $F_{REF}$. The output of the phase detector is low pass filtered at 312 and the output of the low pass filter 312 controls a coarse tuning of all taps of delay line 304 simultaneously. The output signal is taken as some combination of one or more of the output taps of delay line 304 that is provided by multiplexer 316 under control of a tap selection processor 320. Processor 320 selects taps in any suitable manner that produces the desired output waveform $F_{OUT}$. In addition to a coarse tuning input 322 that is used to provide an overall correction voltage to all delay elements simultaneously, delay line 304 is provided with a tuning input for each of the delay elements (or in an alternative, collections of delay elements) that can be used to adjust the individual delay of each element (or collection of elements) independently of the others. A pair of multiplexers 330 and 334, operating under control of a second tap selection processor 340, can be used to select outputs from selected taps (e.g., pairs of adjacent taps) to determine how individual delay elements are behaving. This information is obtained in a phase detector 344 that drives a tuning circuit 350. Thus, phase detector 344 can be used to measure a particular delay element's actual delay, a correction voltage can be calculated in error calculator 346 and tuning circuit 350 can be used to apply a suitable voltage to that delay element's fine tuning control line 360 to make correction to an errant delay value. Error calculator 346 can be implemented as a part of a programmable processor forming a part of the device incorporating the DLL 300 or may be separately provided as a hardware or software based processor (e.g., it may form a part of tap selection processor 340 and/or 320).

Figure 4:
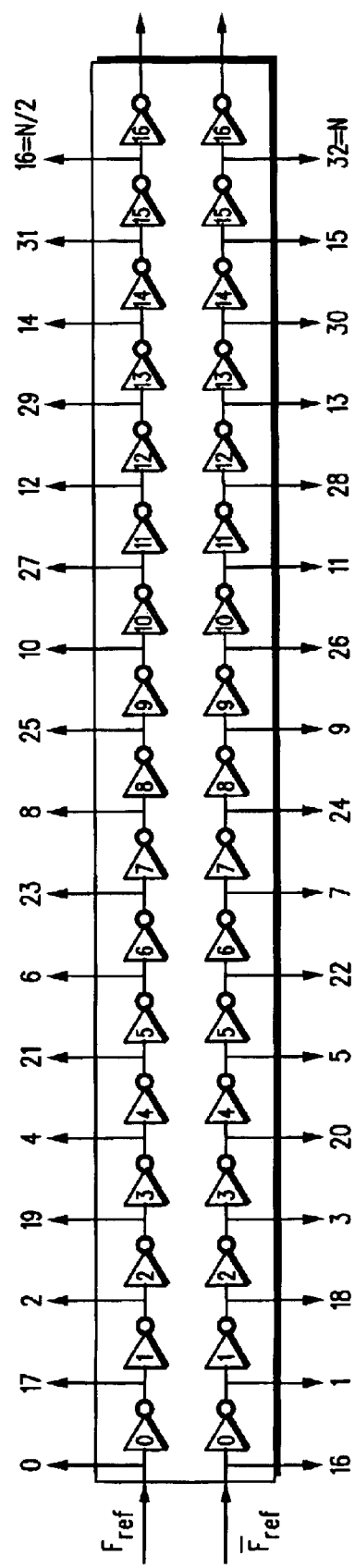
FIG. 4 depicts an alternative delay line structure that can be used in certain embodiments consistent with the present invention.

FIG. 4 depicts an alternative delay line structure 380 that can be used in certain embodiments consistent with the present invention. In this embodiment, differential input clock signals that are 180 degrees out of phase are used to drive the delay line, which is split into two segments that are N/2 in length. The taps of the delay line are also rearranged. Since the delay line will be locked to a wavelength of $F_{REF}$, the rearrangement shown is possible by viewing the output as either inverted or non-inverted as required for proper interpretation of the delay.

Figure 3:
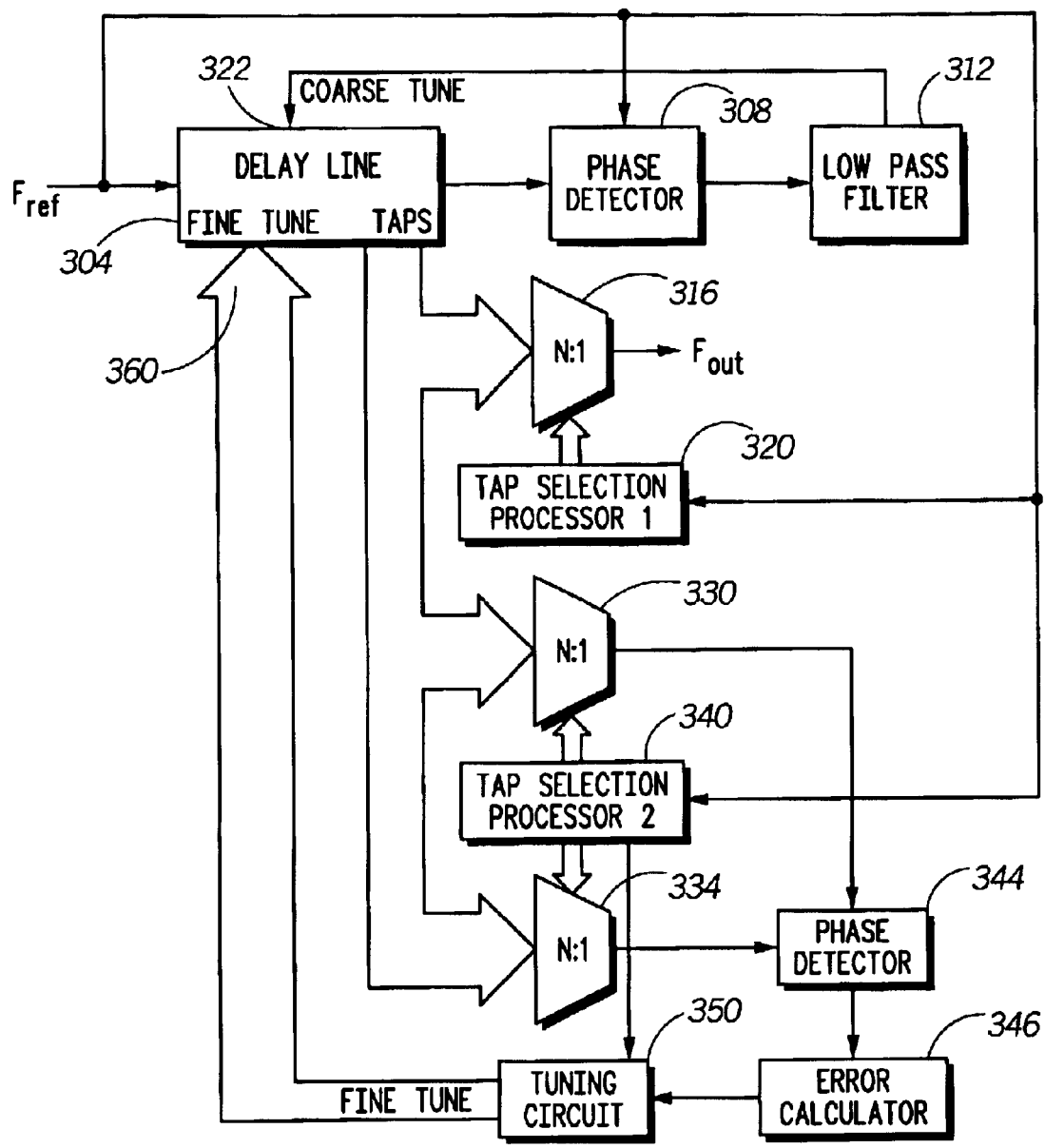
FIG. 3 is a delay locked loop with delay error correction consistent with certain embodiments of the present invention.
Figure 5:
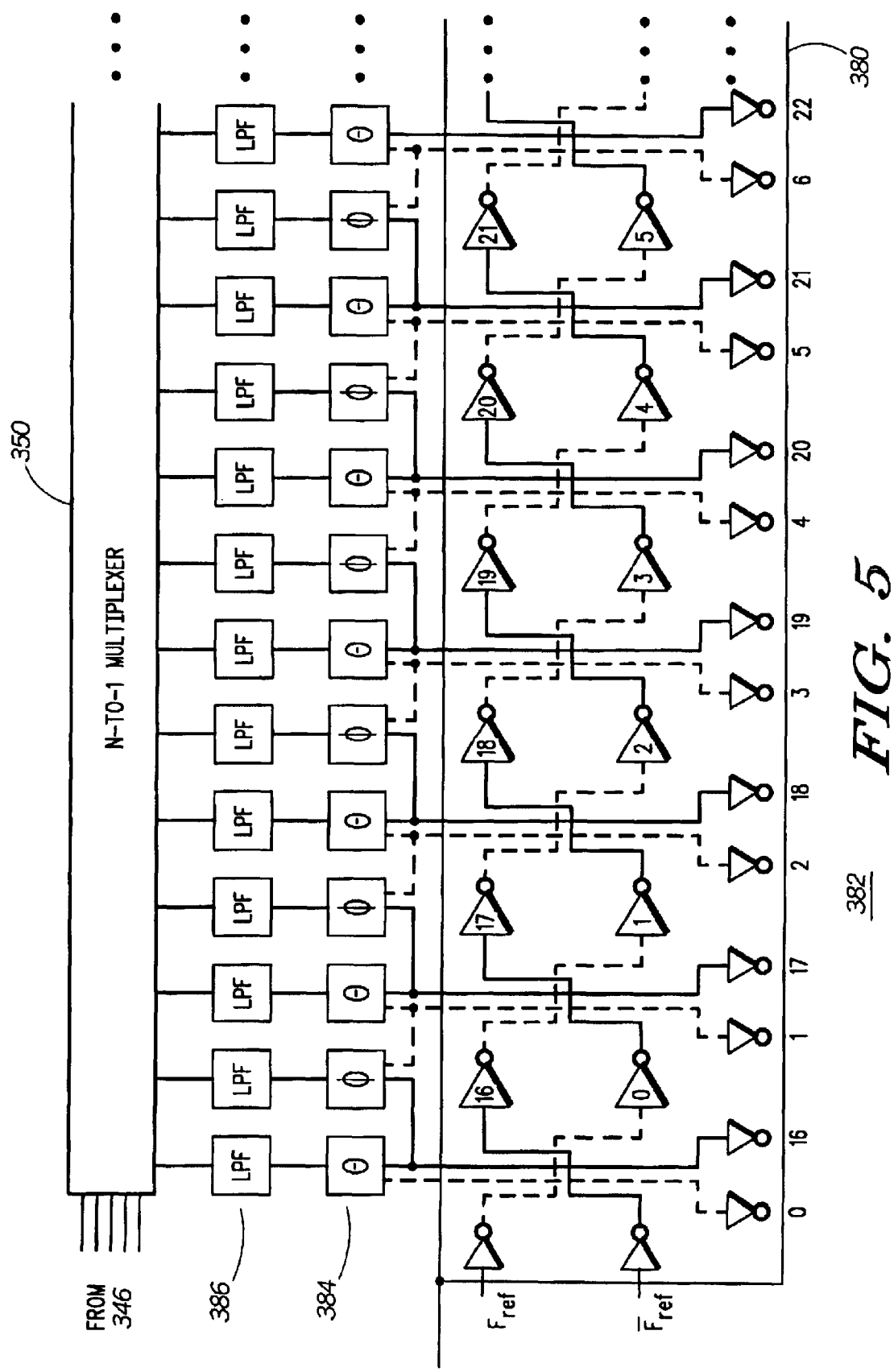
FIG. 5 illustrates alternative components of a delay locked loop circuit with delay error correction consistent with and alternate embodiment of the present invention.

The alternative delay line structure 380 described in connection with FIG. 4 can be used in an alternative delay line delay compensation architecture 382 as shown in FIG. 5, where certain limitations associated with the system in FIG. 3 are overcome. The implementation of FIG. 3 uses a common phase detector to measure taps routed form different locations. Care should be taken to insure each of the many routing paths have approximately identical delay lengths, and this is depicted by the overlapping solid and broken lines connecting the delay element. Any difference in the routing delay becomes part of the delay measurement and is compensated for in this structure. This routing path difference is overcome with the architecture of FIG. 5 with the use of a plurality of dedicated phase detectors that are structured so that the delay of each delay element can be individually measured using either a single measurement of phase difference from input to output, or by using multiple phase difference measurements and calculating the delay of a particular delay element. Each phase detector output is low pass filtered to a DC delay measurement value with a corresponding plurality of low pass filters 386. This DC value is then routed to a multiplexed selection network.

Thus, correction values can be individually generated for each delay element and that correction value used to correct the delay associated with any individual delay element to thereby equalize the delay across the delay line 380. The routing delay difference associated with the DC detection value is not likely to be an issue. However, the phase detector matching could be an issue that may require multiple phase detector networks across each delay to provide additional information, where this additional information would be used to improve the phase detection measurement confidence. It will be evident upon consideration of this discussion that other embodiments can be devised wherein the delay line uses four quadrature fed delay elements, each having a quarter wavelength delay.

Figure 6:
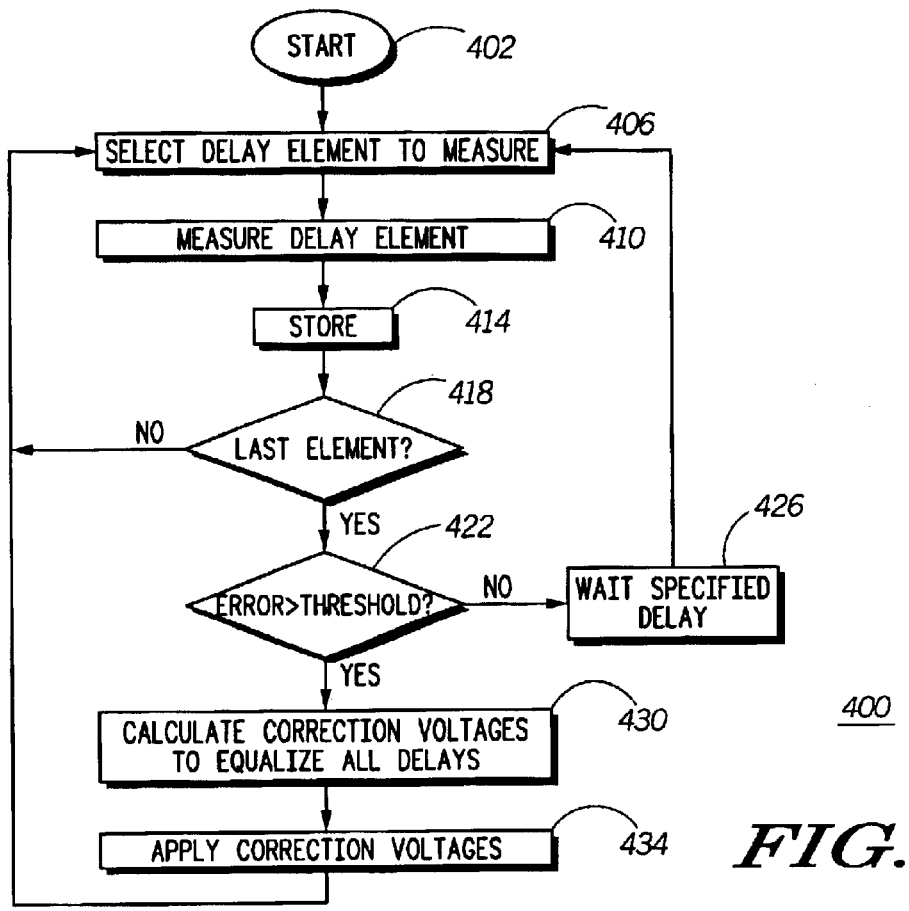
FIG. 6 is a flow chart depicting one adjustment process consistent with certain embodiments of the present invention.

Any number of suitable algorithms can be applied to implement a tap selection and fine-tuning process with circuit 300 or 380 or as described in connection with FIG. 5. One exemplary process is depicted in flow chart form as process 400 of FIG. 6 starting at 402. In this process, all tap delays are first measured and then corrections are computed and applied to make all delays equal. The delay value measurement can be made on a variety of tap selection combinations in a variety of ways with the objective of making adjacent values equal while the delay locked loop remains locked. The DLL's coarse adjustment process is used to collectively move all tap delays simultaneously in a manner to achieve lock. In this embodiment, a delay element is selected (e.g., the first delay element) at 406. The two multiplexers 330 and 334 are then set to take the input and output of the selected delay element by tap selection processor 340. Phase detector 344 (or any other suitable delay measurement network) makes a measurement of the delay at 410 and that measurement is stored at 414 (e.g., in a memory associated with error calculator 346). If this delay element is not the last in delay line 304 at 418, another delay element is selected at 406 and the process is repeated until all delay elements have been tested. Once the last delay element has been tested at 418, a determination is made as to whether or not an error threshold has been reached. For example, in the present 32 tap delay line, if no single delay differs from any other by more than a threshold such as 0.1 ps, then it might be deemed that no adjustment is needed and control passes to 426 where the process waits for a specified delay interval before checking again by starting the process again from 406, and no changes are made to any of the fine tuning voltages applied to the individual delay elements (which might start out at a default value).

If an the error threshold has been reached at 422, however, control passes to 430 where error calculator 346 calculates (or looks up in a lookup table) correction voltages that should be applied to each tap to make all tap delays equal. At 434, those correction voltages are then applied to each of the individual tap correction lines of the delay line and held at the desired correction voltage. Control then returns to 406 where the process repeats and the correction voltages are refined until the error threshold comparison is not met at 422. This process, therefore, equalizes the delay of each tap in the delay line at some value of delay. The exact value is not particularly critical since the overall delay of the delay line will be locked to the input clock signal $F_{REF}$ by the normal operation of the DLL. Thus, if the overall delay is correctly locked at the period of $F_{REF}$ and if all delays in the delay line 304 are equal, the individual delays and overall delay will be corrected to within a desired error tolerance. This process can be implemented iteratively to refine the correction of each delay until the delays converge to within acceptable tolerances.

Figure 7:
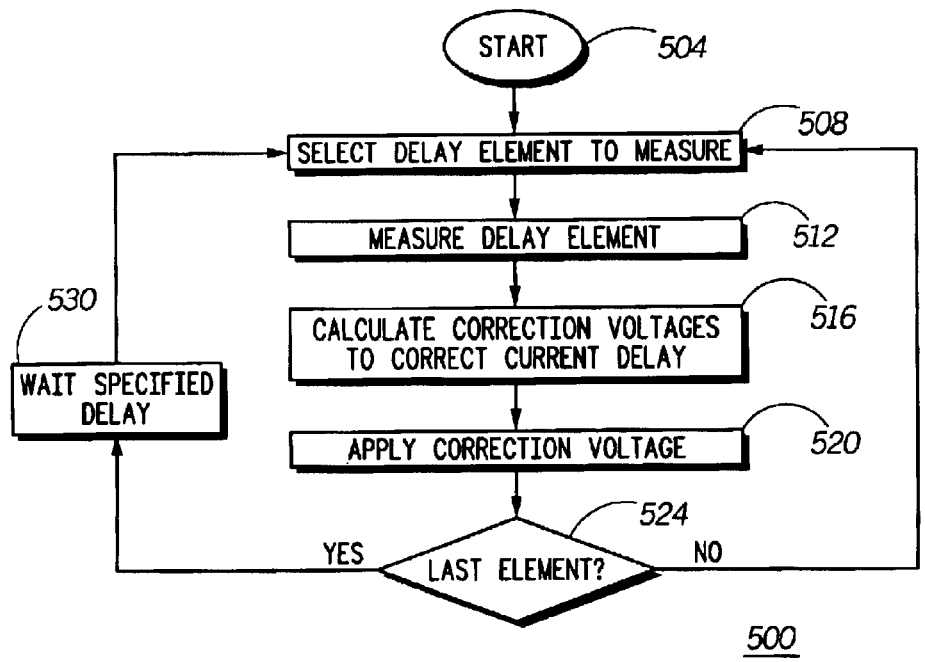
FIG. 7 is a flow chart depicting a second adjustment process consistent with certain embodiments of the present invention.

The process 400 as just described is but one algorithm that can be used to correct the delay of the individual delay elements of the delay line 304. FIG. 7 depicts another process 500 that can alternatively be used to correct the delay line's delay elements starting at 504. At 508 a delay element is selected for measurement and at 512 the element is measured using phase detector 344. At 516, error calculator 346 calculates an error from the ideal delay desired and determines a correction voltage to be applied to the delay element. This correction voltage is then applied and held at 520. The process repeats starting at 508 for each delay element in the delay line 304 until the last element is reached at 524. When the last element is reached, a specified time delay is implemented at 530 until another adjustment cycle is to be implemented. In both process 400 and 500 it is presumed that the correction process can be run, corrections can be-applied and then no correction will be needed for some specified time period (e.g., 10 minutes, one hour, etc.). The time period selected should provide for drifting of the delays caused by temperature and other operational parameters, so that a correction cycle is entered, frequently enough to prevent errors from becoming excessive for the particular environment of use of the DLL. Many variations of processes 400 and 500 can be implemented without departing from the present invention.

For example, an alternative implementation could have the individual measurements of FIG. 5 continuously processed to obtain an average value. This average value represents the average delay value of the individual delay elements making up the delay line network. This average value would be used in a continuous comparison with each of the individual phase detector network measurement values. The output of this comparison is an error value used in a continuously closed fine tune adjustment feedback loop. Each of the delay elements may have a fine tune feedback network to continuously maintain equal delay.

For example, an alternative implementation would have the individual measurements of FIG. 4 continuously processed to obtain an average value. This average value represents the average delay value of the individual delay elements comprising the delay line network. This average value can be used in a continuous comparison with each of the individual phase detector network measurement values. The output of this comparison represents an error value used in a continuously closed fine tune adjustment feedback loop. Each of the delay elements could have a fine tune feedback network to continuously maintain equal delay.

These individual tap time offset measurements can be made while the DLL's direct digital signal synthesis processing is operating. This means that the calibration process can be operating continuously as a background process, updating performance as needed to overcome environmental conditions as well as systematic delay variations. This calibration process is independent of any type of signal synthesis including application of modulation on the signal. The information obtained from the tap delay measurements can be used in an analog or digital sample and hold feedback to adjust the individual delay elements. One example would be floating gate analog memory storage applied to voltage defining the current control value.

In order to provide coarse and fine adjustments for each of the delay elements of the delay line, any number of techniques could be employed. In one embodiment, depicted as circuit 600 of FIG. 8, a pair of series connected CMOS (Complementary Metal Oxide Semiconductor) inverters 604 are used to form each of the delay elements with offset measurements taken at the input and output thereof (which will by definition be adjacent delay line taps. The amount of current from current source 606 available to the inverters forming the delay element 604 determines the overall delay between input signal at 608 and output signal at 612. In the embodiment illustrated, coarse control of the current supplied by current source 606 is implemented by application of a control voltage to the gate of transistor 620. A floating gate transistor 624 is used to supply individual control to the delay element 604 by similarly controlling the amount of current supplied by current source 606. In the example shown, transistors 620 and 624 are connected in parallel so that the source to drain current through these transistors is in parallel and thus additive. Transistor 620 is also shown to be 10 times the size of transistor 624 so that this transistor dominates control over the current supplied by a factor of 10. In one embodiment consistent with the present invention, each of the buffer delay elements in the delay line will have such a coarse and fine tune control with all of the coarse control transistor gates tied together and controlled by the low pass filter 312 of the DLL 300. The gates of the fine tune control transistors such as 624 form the individual inputs for the tuning circuit 350 for each of the delay elements.

Figure 8:
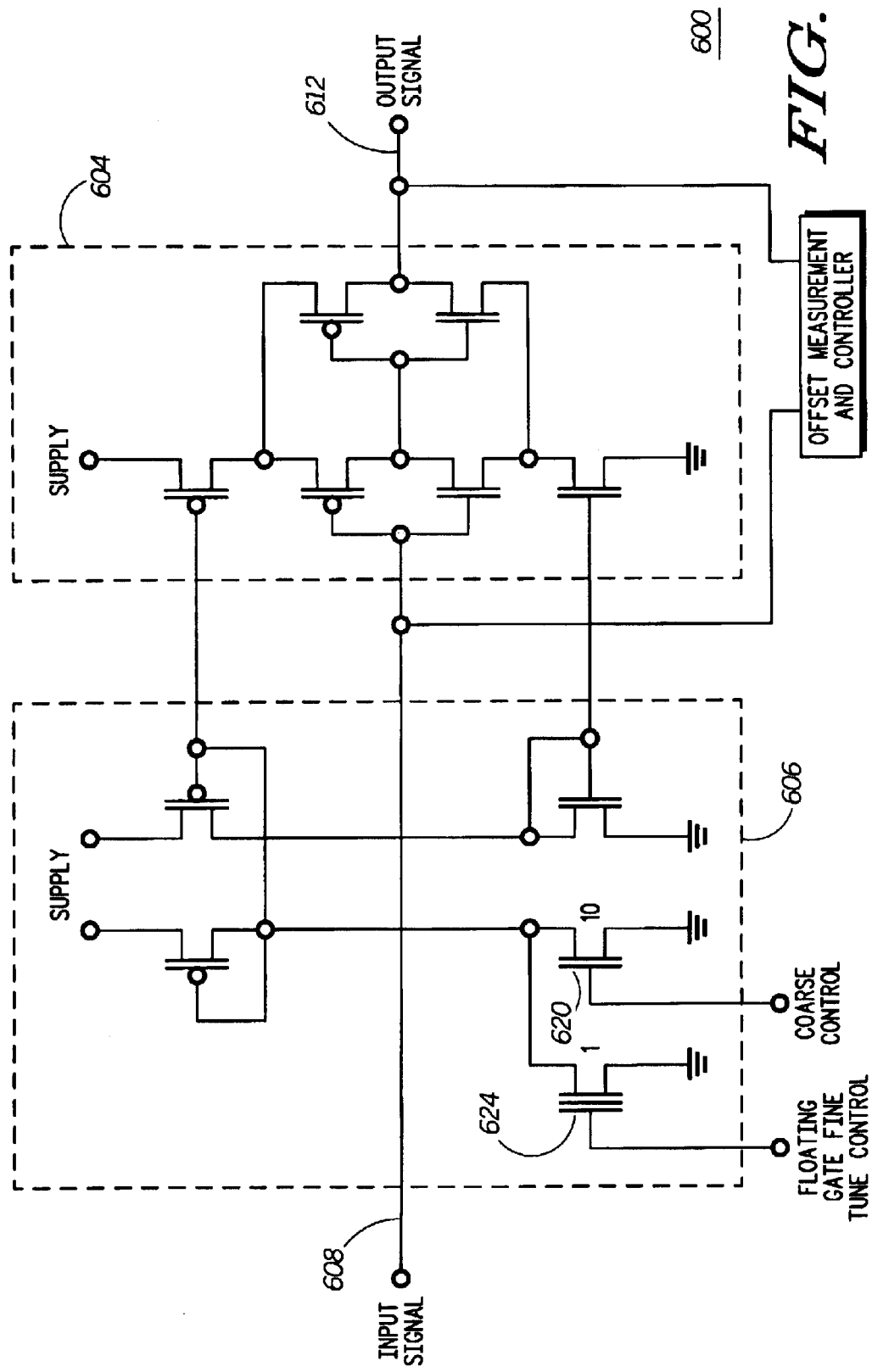
FIG. 8 is a circuit of a delay line delay element consistent with certain embodiments of the present invention.

In the exemplary delay adjustment method shown in FIG. 8 for an inverter circuit, the output node charge and discharge duration is adjusted with a current control device in the inverter supply and ground terminals. A fine tune is implemented with a floating gate device, while a coarse tune is provided by a similar non floating device that is 10 times larger than the fine tune device. Many alternative adjustment implementations exist such as the use of pfet transistor devices instead of the nfet devices shown. Another alternative would include inverter device well tie voltage or the DC supply level as the control signal.

The delay element depicted in FIG. 8 provides a single control for fine tuning of the delay element which is suitable for use with a delay line structure that uses two series connected inverters as a delay element. When smaller amounts of delay are needed to produce finer time resolutions, two inverter delays per delay element may be too much absolute delay per element. In such situations, a single inverter delay may be utilized using various differential configurations of the delay line structure, but bearing in mind that the maximum error associated with each delay element may be even more critical than for longer duration delay elements. Use of a single inverter for a delay element can be accomplished, for example, by driving the delay line with both inverted and non-inverted clocks driving parallel delay lines using a single inversion as the delay element. In other examples, a delay line in which alternate outputs are of different logical sense can be used, so long as the alternation in sense is accounted for in some manner. When such an approach is used, individual adjustment of the rise and fall time associated with each individual delay element may be needed in order to equalize all delays in the delay line.

Figure 9:
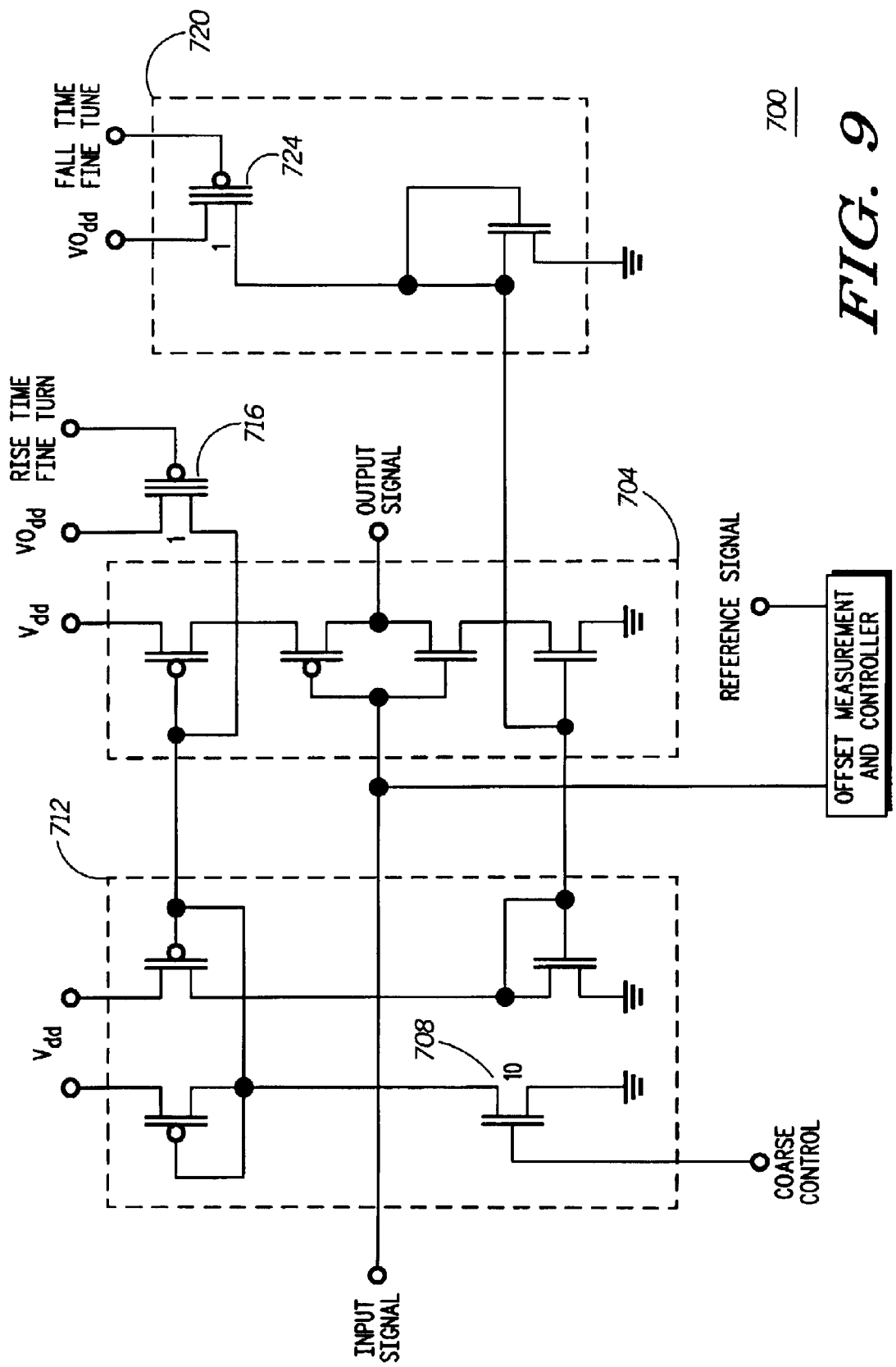
FIG. 9 is another circuit of a delay line delay element consistent with certain embodiments of the present invention.

This single control approach depicted in connection with circuit 600 provides for no individual tuning of both rise time and fall time in the buffer delay element. FIG. 9 depicts a buffer delay element 700 in which both rise time and fall time delays can be independently controlled. The basic buffer circuit is depicted as an inverter 704 (thus, an additional inversion may be used to retain the polarity of the input signal at the ultimate output). Coarse tuning is obtained by applying a control voltage to the gate of transistor 708 of current source 712 that operates in much the same manner as in circuit 600. In this implementation, drain current is individually adjustable by floating gate transistor 716 that supplies a varying amount of drain current to the inverter 704 depending upon the voltage applied to the gate thereof in order to provide fine adjustment of the rise time. In a similar manner a current source 720 supplies additional source current to the inverter circuit dependent upon the amount of current applied to the floating gate of transistor 724 to provide fine tuning of the fall time of the signal at the output 730 of inverter 704. In this embodiment, the rise and fall time can be individually controlled to cause the delay elements to produce delay signals that match a reference signal.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors, which are to be considered equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

Those skilled in the art will appreciate that the program steps and associated data used to implement the embodiments described above can be implemented using any suitable computer readable storage medium such as for example disc storage, Read Only Memory (ROM) devices, Random Access Memory (RAM) devices, semiconductor storage elements, optical storage elements, magnetic storage elements, magneto-optical storage elements, flash memory, core memory and/or other equivalent storage technologies without departing from the present invention. Such alternative storage devices should be considered equivalents.

The present invention, as described in embodiments herein, is implemented using a programmed processor executing programming instructions that are broadly described above in flow chart form that can be stored on any suitable computer readable storage medium (e.g., disc storage, optical storage, semiconductor storage, etc.) or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A delay locked loop, comprising:
a delay line having a plurality of delay elements, an input for receiving a reference clock signal $F_{REF}$, a delayed output and a plurality of delay tap outputs;
the delay line further comprising a coarse adjustment input that provides an overall adjustment of all of the delay line's delay elements in response to a coarse adjustment control signal applied thereto;
the delay line further comprising a plurality of fine adjustment inputs, at least one for each delay element, for application of a fine adjustment signal thereto to adjust the individual delay parameters of each delay element;
a phase comparator comparing the delay line's delayed output to the reference clock signal and producing an output related thereto;
a low pass filter receiving the phase detector output and controlling an overall delay from input to output of the delay line by application of a coarse adjustment control signal to the coarse adjustment input;
a first multiplexer receiving the delay tap outputs and producing a first selected output;
a second multiplexer receiving the delay tap outputs and producing a second selected output;
a measurement circuit that measures a difference between the first selected output and second selected output as a measurement of a selected delay element's delay value;
an error calculator that receives the output of the measurement circuit and that calculates fine adjustment signal for each of the selected delay elements; and
a tuning circuit that applies the fine adjustment signals to the plurality of fine adjustment inputs of the delay line.

2. The delay locked loop according to claim 1, wherein the delay elements each comprise a pair of series connected inverters.

3. The delay locked loop according to claim 2, wherein each of the delay elements have a current source associated therewith, and wherein the delay of the delay elements is controlled by varying the current available from the current source.

4. The delay locked loop according to claim 1, wherein the delay elements each comprise an inverter.

5. The delay locked loop according to claim 4, wherein each of the delay elements have a current source associated therewith, and wherein the delay of the delay elements is controlled by varying the current available from the current source.

6. The delay locked loop according to claim 5, wherein varying the current available from the current source varies the rise time of output signals produced by the delay element.

7. The delay locked loop according to claim 5, wherein varying the current available from the current source varies the fall time of output signals produced by the delay element.

8. The delay locked loop according to claim 1, further comprising a third multiplexer receiving the delay tap outputs, the third multiplexer producing a synthesized output signal by controlled selection of one or more delay tap outputs as an output thereof.

9. The delay locked loop according to claim 1, wherein the phase comparator comprises a network of phase detectors, with each phase detector in the network of phase detectors producing a DC output level representing a time delay value for at least one of the plurality of delay elements.

10. The delay locked loop according to claim 9, wherein each one of the plurality of phase detectors is coupled to a corresponding one of the delay elements to provide enhanced phase detection accuracy.

11. The delay locked loop according to claim 1, wherein the delay line comprises a plurality of series connected delay elements totaling one wavelength delay.

12. The delay locked loop according to claim 1, wherein the delay line comprises two sections of series connected delay elements that are differentially fed, each section totaling one half wavelength delay.

13. The delay locked loop according to claim 1, wherein the delay line comprises four sections of series connected delay elements that are quadrature fed, each section totaling one quarter wavelength delay.

14. A method of adjusting delay elements in a delay locked loop's delay line, comprising:
   a) locking the delay locked loop to a reference clock input;
   b) measuring a delay associated with each delay element in the delay line;
   c) calculating a correction signal to be applied to each delay element in the delay line; and
   d) applying the correction signal to each delay element so that the delay of each delay element is approximately equal.

15. The method according to claim 14, further comprising repeating b), c) and d) to refine the value of the correction signal until a delay error is less than a threshold value.

16. The method according to claim 14, further comprising measuring a delay error after a) to determine if the delay error is greater than a threshold value.

17. The method according to claim 16, wherein the delay error is greater than a threshold if any one of the delay elements has a delay error greater than the threshold.

18. The method according to claim 16, further comprising carrying out b), c) and d) only if the delay error is greater than a threshold.

19. The method according to claim 14, wherein the delay element comprises a buffer delay element and the correction signal controls an amount of current supplied to the buffer delay element.

20. The method according to claim 14, wherein the delay element comprises an inverter delay element and the correction signal controls an amount of current supplied to the inverter delay element.

21. A method of adjusting delay elements in a delay locked loop's delay line, comprising:
   a) locking the delay locked loop to a reference clock input;
   b) measuring a delay associated with each delay element in the delay line and comparing that delay with a reference delay;
   c) calculating a correction signal to be applied to each delay element in the delay line; and
   d) applying the correction signal to each delay element so that the delay of each delay element is approximately equal to a reference delay.

22. The method according to claim 21, further comprising repeating b), c) and d) to refine the value of the correction signal until a delay error is less than a threshold value.

23. The method according to claim 21, further comprising measuring a delay error after a) to determine if the delay error is greater than a threshold value.

24. The method according to claim 23, wherein the delay error is greater than a threshold if any one of the delay elements has a delay error greater than the threshold.

25. The method according to claim 23, further comprising carrying out b), c) and d) only if the delay error is greater than a threshold.

26. The method according to claim 21, wherein the delay element comprises a buffer delay element and the correction signal controls an amount of current supplied to the buffer delay element.

27. The method according to claim 21, wherein the delay element comprises an inverter delay element and the correction signal controls an amount of current supplied to the inverter delay element.

* * * * *